United States Patent
Huang et al.

(10) Patent No.: US 8,598,636 B2
(45) Date of Patent: Dec. 3, 2013

(54) HEAT DISSIPATION STRUCTURE OF SOI FIELD EFFECT TRANSISTOR

(75) Inventors: Ru Huang, Beijing (CN); Xin Huang, Beijing (CN); Shoubin Xue, Beijing (CN); Yujie Ai, Beijing (CN)

(73) Assignee: Peking University, Beijing (CN)

( * ) Notice: Subject to any disclaimer, the term of this patent is extended or adjusted under 35 U.S.C. 154(b) by 3 days.

(21) Appl. No.: 13/582,624

(22) PCT Filed: Aug. 17, 2011

(86) PCT No.: PCT/CN2011/078507
§ 371 (c)(1),
(2), (4) Date: Sep. 4, 2012

(87) PCT Pub. No.: WO2012/025025
PCT Pub. Date: Mar. 1, 2012

(65) Prior Publication Data
US 2013/0001655 A1    Jan. 3, 2013

(30) Foreign Application Priority Data
Aug. 23, 2010    (CN) .......................... 2010 1 0259659

(51) Int. Cl.
H01L 29/80    (2006.01)

(52) U.S. Cl.
USPC ............. 257/256; 257/E29.311; 257/E23.082

(58) Field of Classification Search
USPC .......................... 257/256, E29.311, E23.082
See application file for complete search history.

(56) References Cited

U.S. PATENT DOCUMENTS

| | | |
|---|---|---|
| 6,674,128 B1 | 1/2004 | Fisher |
| 6,800,933 B1 | 10/2004 | Mathews et al. |
| 7,250,327 B2 | 7/2007 | Sakamoto |
| 7,541,644 B2 | 6/2009 | Hirano et al. |
| 2002/0179942 A1* | 12/2002 | Tihanyi .......................... 257/213 |
| 2005/0012121 A1* | 1/2005 | Tihanyi et al. ................. 257/256 |
| 2009/0008721 A1* | 1/2009 | Furuta ............................ 257/369 |

FOREIGN PATENT DOCUMENTS

CN    101930954 A    12/2010

* cited by examiner

*Primary Examiner* — Timor Karimy
(74) *Attorney, Agent, or Firm* — Bozicevic, Field & Francis LLP; Bret E. Field

(57) ABSTRACT

The present invention discloses a heat dissipation structure for a SOI field effect transistor having a schottky source/drain, which relates to a field of microelectronics. The heat dissipation structure includes two holes connected with a drain terminal or with both a source terminal and a drain terminal, which are filled with an N-type material with high thermoelectric coefficient and a P-type material with high thermoelectric coefficient respectively. A metal wire for the N-type material with high thermoelectric coefficient in the vicinity of the drain terminal is applied a high potential with respect to the drain terminal, and a metal wire for the P-type material with high thermoelectric coefficient in the vicinity of the drain terminal is applied a low potential with respect to the drain terminal. A metal wire for the N-type material with high thermoelectric coefficient in the vicinity of the source terminal is applied a high potential with respect to the source terminal, and a metal wire for the P-type material in the vicinity of the source terminal is applied a lower potential with respect to the source terminal. By way of a Peltier effect, in the present invention heat can be absorbed at a contact portion between the thermoelectric material and the source/drain, and at the same time dissipated at a connection portion between the thermoelectric material and a bottom electrode metal, so that the heat generated in an active region of the device is effectively transferred to the substrate and dissipated through a heat sink.

10 Claims, 7 Drawing Sheets

HEAT DISSIPATION STRUCTURE OF SOI FIELD EFFECT TRANSISTOR

FIELD OF THE INVENTION

The present invention relates to a field of microelectronics, and particularly relates to a heat dissipation structure for a SOI field effect transistor having a schottky source/drain.

BACKGROUND OF THE INVENTION

With reduction in size of devices, a SOI field effect transistor is widely used in the industry with its advantages such as an excellent subthreshold swing, a small leakage current, and an effective suppression of a short channel effect and so on. Furthermore, in order to reduce series resistance of source/drain and further improve device performance, there has been a growing attention on a SOI field effect transistor having a schottky source/drain.

On the other hand, however, the SOI field effect transistor has a limitation on the performance of the device to some extent due to a self-heating effect thereof. For a bulk silicon field effect transistor, the heat generated in the device is substantially dissipated through a bulk silicon substrate. However, the SOI field effect transistor has a thick silicon oxide layer (generally in order of hundreds nanometers). Since the thermal conductivity of silicon oxide is only 1.38 W/m/K at room temperature, which is much smaller than that of the bulk silicon, the heat dissipation from a channel to the substrate is hindered. Furthermore, the SOI field effect transistor includes a very thin silicon film, where the thermal conductivity of the silicon film is smaller than that of the bulk silicon due to a surface phonon scattering, thus resulting in the heat dissipation is further suppressed. Therefore, as compared with the bulk silicon field effect transistor, the SOI field effect transistor has a significant self-heating effect, which adversely affects the electrical performance and reliability of the device. In order to reduce the self-heating effect of the SOI field effect transistor, one method, in which a heat dissipating layer with high thermal conductivity (such as graphene) is added onto a buried oxide layer so that the heat is dissipated through lateral sides, is adopted. Moreover, another method is that, a STI region is filled with a material with high thermal conductivity (such as diamond), and the STI region is extended to pass through a buried oxide layer and contact with a silicon substrate. In each of the above methods, since the heat dissipation structure is not connected to the device directly, the dissipation effect is poor.

SUMMARY OF THE INVENTION

An object of the present invention is to provide a heat dissipation structure for a SOI field effect transistor having a schottky source/drain, which can solve a problem of self-heating effect of conventional type devices.

A heat dissipation structure for a SOI field effect transistor having a schottky source/drain provided by the present invention is as shown in FIG. 3. The heat dissipation structure includes two holes disposed under the source and the drain, which are filled with an N-type material with high thermoelectric coefficient and a P-type material with high thermoelectric coefficient, respectively. Alternatively, the structure may include holes disposed at the drain terminal only, because the generated heat is mainly concentrated on the drain terminal. The heat dissipation efficiency can be increased by disposing holes at both of the source and the drain. The N-type material with high thermoelectric coefficient and the P-type material with high thermoelectric coefficient are connected with the drain terminal of the field effect transistor in manner of ohmic contact; and a metal wire for the N-type material with high thermoelectric coefficient in the vicinity of the drain terminal is applied a high potential with respect to the drain terminal, and a metal wire for the P-type material with high thermoelectric coefficient in the vicinity of the drain terminal is applied a low potential with respect to the drain terminal. Meanwhile, the N-type material with high thermoelectric coefficient and the P-type material with high thermoelectric coefficient are connected with the source terminal of the field effect transistor in manner of ohmic contact; and a metal wire for the N-type material with high thermoelectric coefficient in the vicinity of the source terminal is applied a high potential with respect to the source terminal, and a metal wire for the P-type material in the vicinity of the source terminal is applied a low potential with respect to the source terminal. Moreover, when the device does not operate or does not need heat dissipation, potentials of metals connected to the materials with high thermoelectric coefficient in the vicinity of the drain terminal are both equal to the drain voltage; and potentials of metals connected to the materials with high thermoelectric coefficient in the vicinity of the source terminal are both equal to the source voltage. By way of the Peltier effect, in the present invention heat can be absorbed at the contact portions between the thermoelectric materials and the source/drain, and be dissipated at the connection portions between the thermoelectric materials and bottom electrode metals, so that the heat generated in an active region of the device is effectively transferred to the substrate and dissipated through a heat sink.

Advantages of the present invention lie in that, the heat dissipation structure is directly connected with active regions of the device, and through the Peltier effect, temperatures of the source terminal and the drain terminal of the device are reduced, so that the temperature of the channel of the device is effectively reduced, and the performance of the device is improved. When the device does not operate, the heat dissipation structure can be controlled not to operate by setting voltages. The structure may be applied to a 3D circuit structure, and may be applied to all SOI field effect transistors having a schottky source/drain without the limitations of material and structure. Also, the fabrication process of the structure is compatible with CMOS processes.

BRIEF DESCRIPTION OF THE DRAWINGS

In FIGS. 1(a)-1(m), the same reference numbers denote the same parts, in which:

101—a silicon nitride blocking layer 102—a polysilicon gate

103—an n+ source/drain 104—a silicon oxide buried layer in an SOI substrate

105—a substrate 106—a channel (a silicon layer on top of an SOI)

107—a gate oxide layer

108—a silicon oxide (a field oxide layer) 109—a silicon oxide film

110—an N-type thermoelectric material 111—a P-type thermoelectric material

112—a metal (copper)

Figure 2:
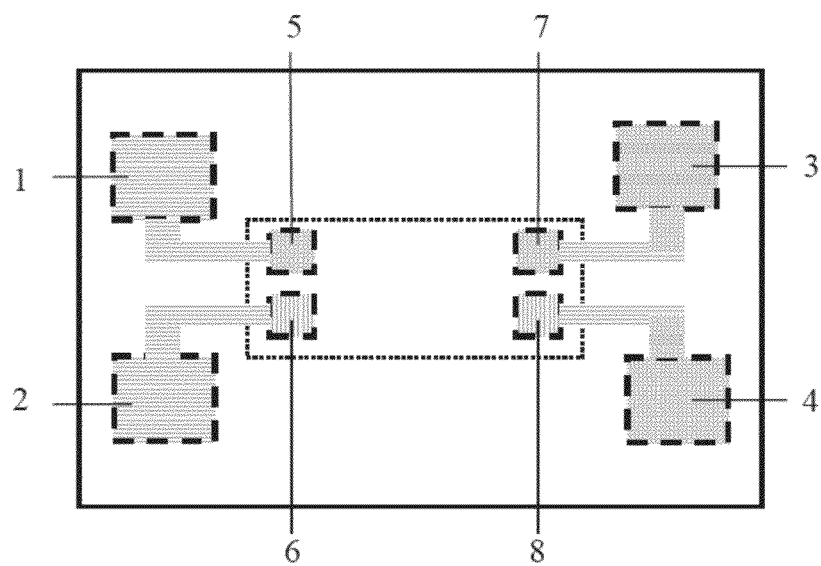

FIG. 2 is a top view of a backside of the heat dissipation structure, and in FIG. 2:

1—V1=Vs+V1 (V1 is positive) 2—V2=Vs−V1 (V1 is positive)

3—V3=Vd−V2 (V2 is positive) 4—V4=Vd+V2 (V2 is positive)

5—an N-type thermoelectric material at the source terminal

6—a P-type thermoelectric material at the source terminal

7—a P-type thermoelectric material at the drain terminal

8—an N-type thermoelectric material at the drain terminal

Figure 3:
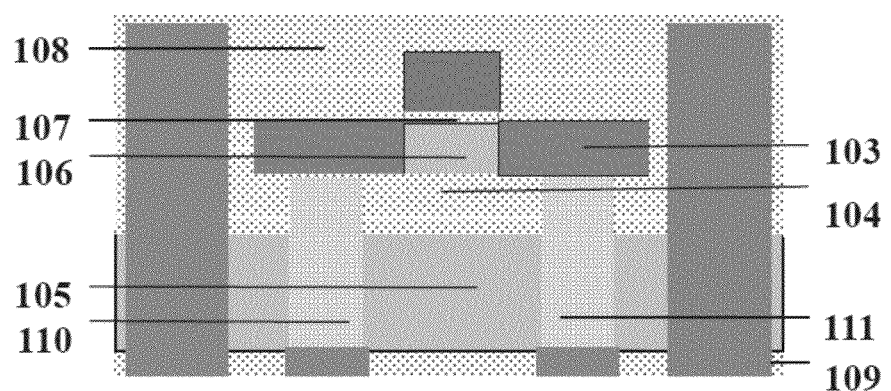

FIG. 3 is a schematic view of a dissipation structure of a SOI field effect transistor according to the present invention.

DETAILED DESCRIPTION OF THE EMBODIMENTS

Hereinafter, the present invention will be further described by examples. It should be noted that the disclosed embodiments is to aid better understand the present invention, and it will be apparent to those skilled in the art that various changes and modifications may be made without departing from the spirit and scope of the invention as defined in the following claims. Thus, the present invention should not be limited to the content disclosed by the embodiments, and the scope of the present invention is determined by the scope defined by the appended claims.

Taking a drain terminal as an example, the drain terminal is connected with two holes in manner of ohmic contact. The holes are filled with an N-type material with high thermoelectric coefficient and a P-type material with high thermoelectric coefficient respectively (typically a compound semiconductor from V-VI group such as $Bi_2Te_3$ and $BI_2Sb$, or a novel nano thermoelectric material). The N-type material is applied a high potential with respect to the drain terminal, and the P-type material is applied a low potential with respect to the drain terminal. By setting bias voltages and doping concentrations of the materials, a current flowing from the N-type material to the drain terminal and a current flowing from the drain terminal to the P-type material have the same magnitude but opposite directions, and thus a magnitude of an output current of the field effect transistor is not affected. When the current flows from the N-type material to the drain terminal and from the drain terminal to the P-type material, heat generated by the channel of the device is absorbed at contact between the materials and the drain using a Peltier effect and a feature that the characteristics of the source/drain in the field effect transistor having a schottky source/drain are similar to metals. Moreover, when the current flows from metal interconnection wires to the N-type material and from the P-type material to the metal wires, heat is dissipated at the contact between the metals and the materials due to the Peltier effect. A method for achieving the function at the source terminal is the same as the above case of the drain terminal.

A process for achieving the above structure mainly includes the following steps.

Figure 1A:
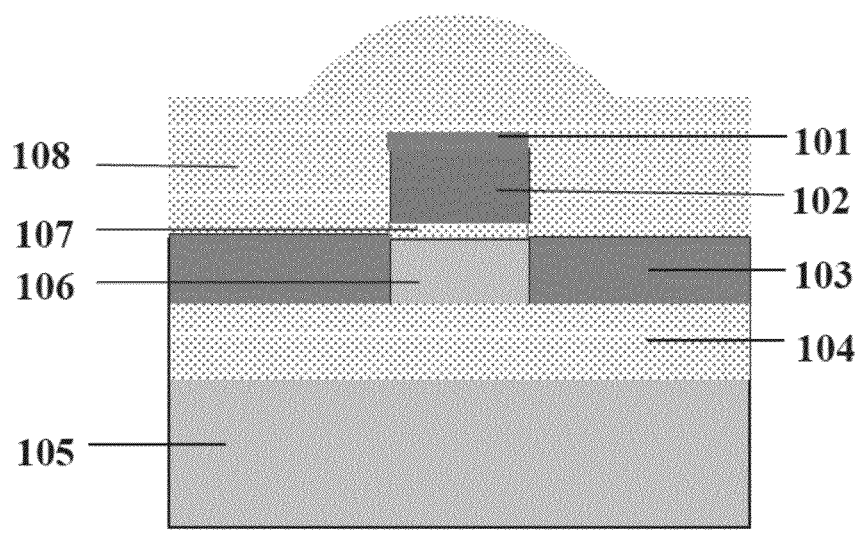
FIGS. 1(a)-1(m) show a process flow diagram for forming a heat dissipation structure of the present invention.

1) A SOI field effect transistor is formed, and a silicon oxide passivation layer is deposited, as shown in FIG. 1(a).

Figure 1B:
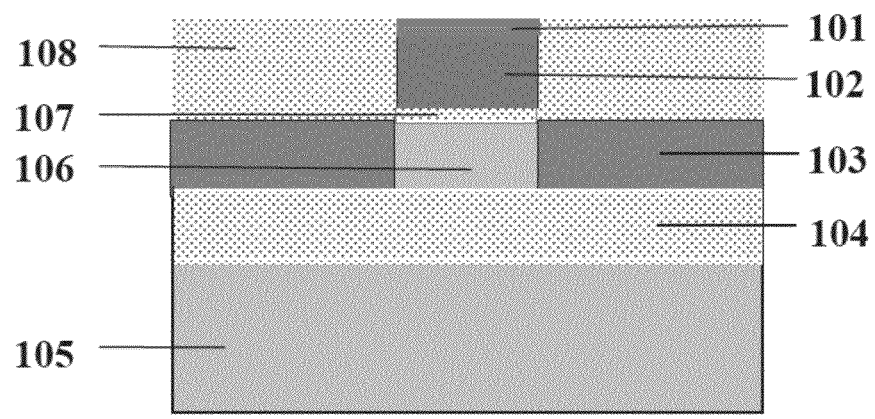

2) The silicon oxide passivation layer is undergone a CMP process by using $Si_3N_4$ as a stop layer, as shown in FIG. 1(b).

Figure 1C:
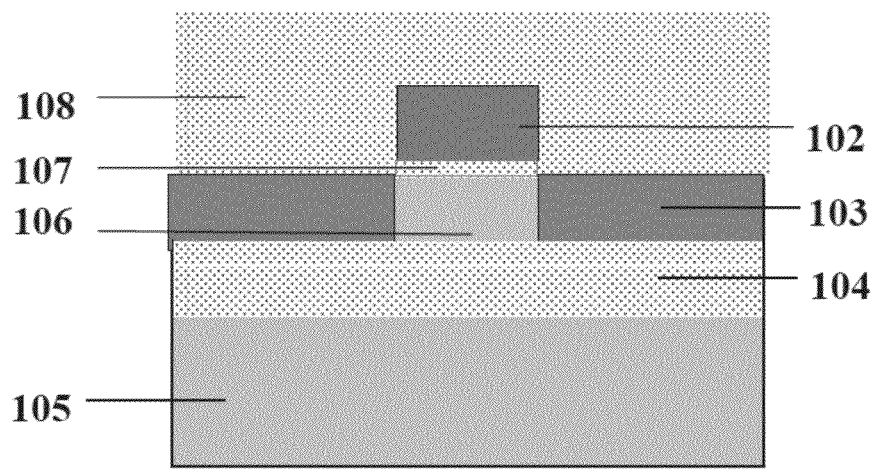

3) Silicon oxide is deposited to form a silicon passivation layer with a planarized surface, as shown in FIG. 1(c).

Figure 1D:
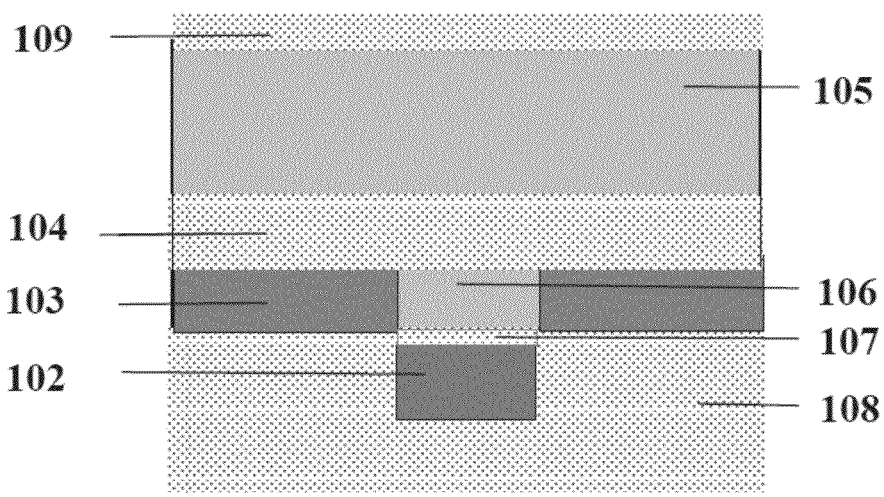

4) The device is reversed, and then a silicon oxide blocking layer is deposited, as shown in FIG. 1(d).

Figure 1E:
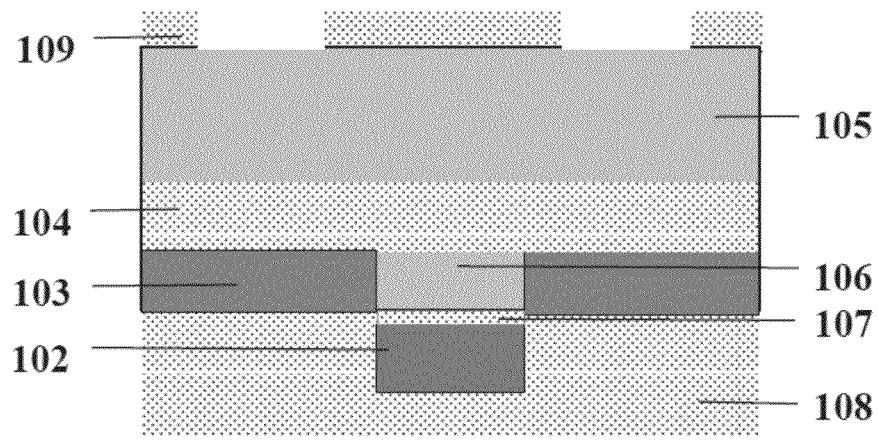

5) The silicon oxide blocking layer is undergone a photolithography process and an erosion process to form patterns of holes, as shown in FIG. 1(e).

Figure 1F:
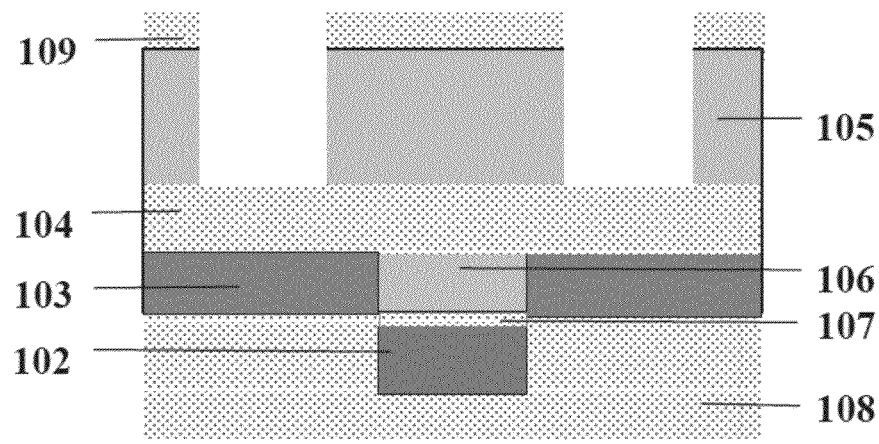

6) The holes are further etched through an anisotropic plasma etching process, by using a buried oxide layer as a stop layer, as shown in FIG. 1(f).

Figure 1G:
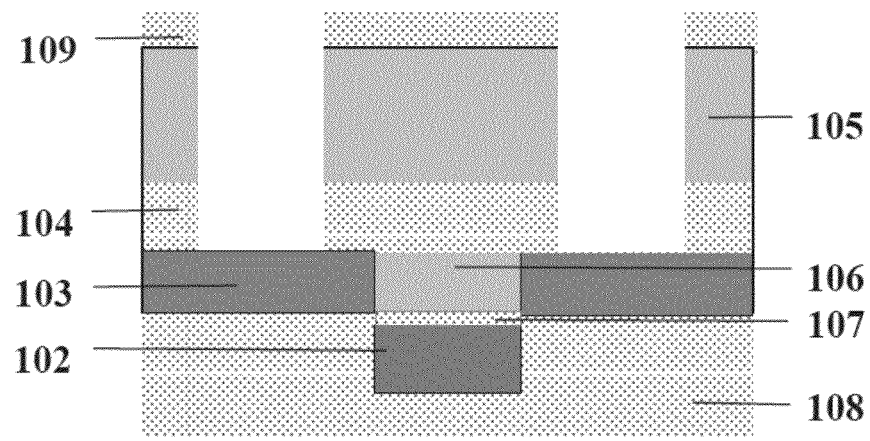

7) The holes are further etched through an anisotropic plasma etching process, by using a source/drain as a stop layer, as shown in FIG. 1(g).

Figure 1H:
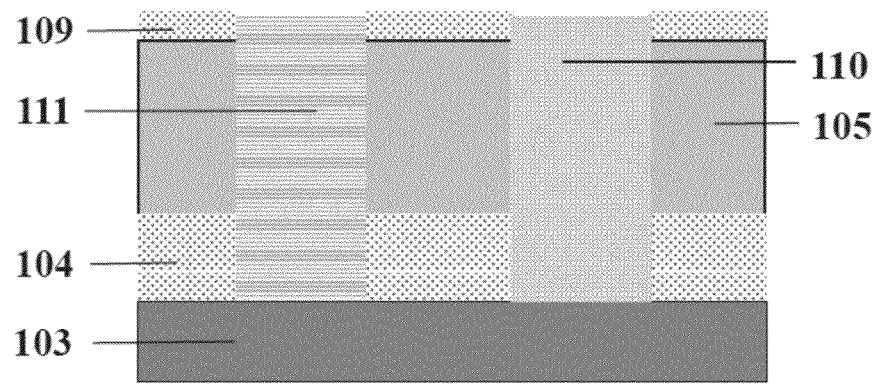

8) A thermoelectric material is deposited and doped in-situ to form an N-type and a P-type thermoelectric material, respectively. An annealing process is performed to form ohmic contacts, as shown in FIG. 1(h)

Figure 1I:
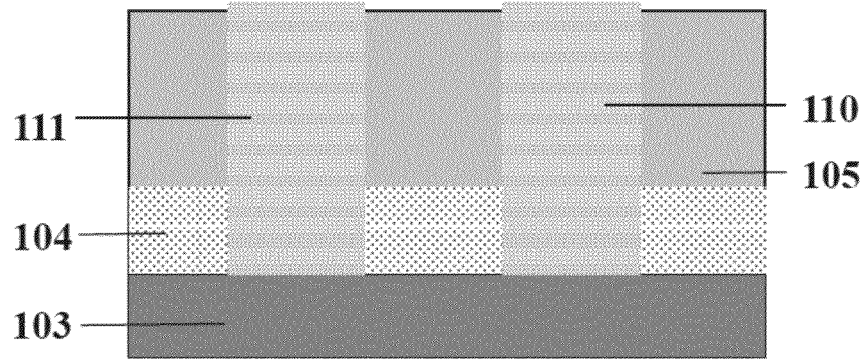

9) The silicon oxide is eroded, as shown in FIG. 1(i).

Figure 1J:
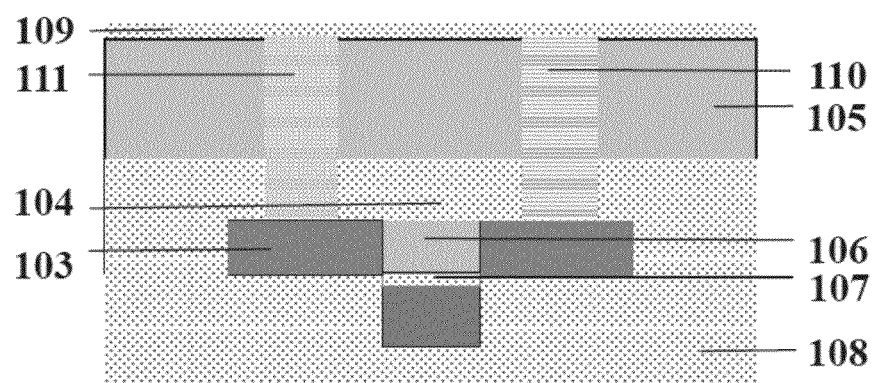

10) A silicon oxide protection layer is deposited to prevent the substrate from being contaminated, as shown in FIG. 1(j).

Figure 1K:
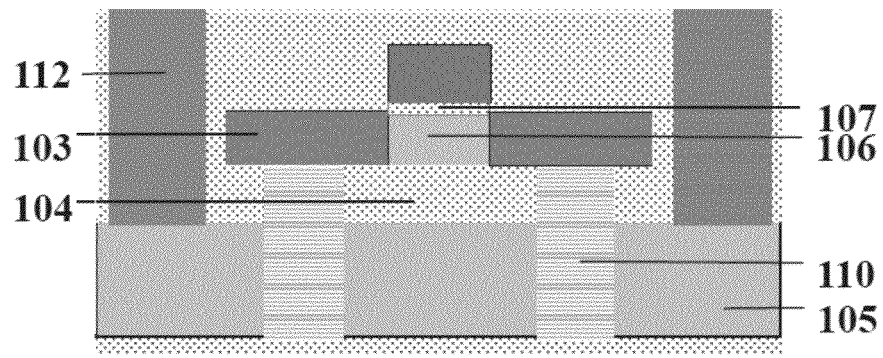

11) Holes for metal connection wires are formed through performing a reactive ion etching process, by using the Si substrate as a stop layer. Then a metal is deposited, as shown in FIG. 1(k).

Figure 1L:
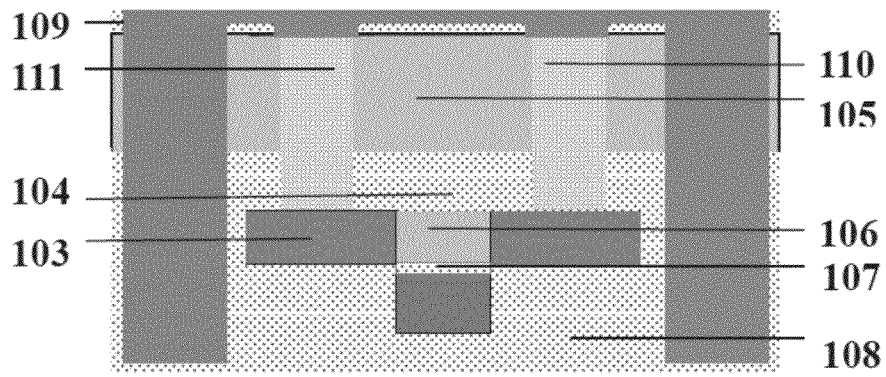

12) The device is reversed, and holes for metal connection wires are formed by an anisotropic plasma etching process. Then a metal is deposited, as shown in FIG. 1(l).

Figure 1M:
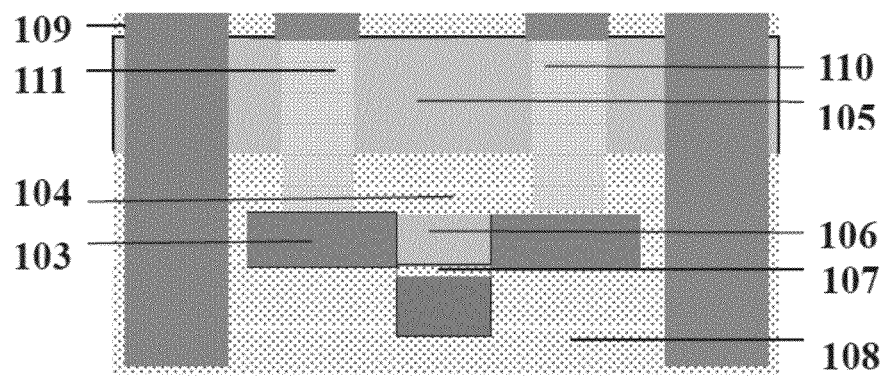

13) The metal is planarized through a CMP process by using the silicon oxide protection layer as a stop layer, as shown in FIG. 1(m).

In the present invention, currents flowing in the N-type material and the P-type material at the source terminal/the drain terminal have the same magnitude but opposite directions. Moreover, materials for filling the holes have very small resistance compared with that of the substrate. The N-type and P-type material at the same terminal may be designed to be spaced apart as far as possible, so that a current flowing from the material to the substrate may be neglected.

In the present invention, the selected N-type thermoelectric material and P-type thermoelectric material are both heavily doped and have identical small resistance but the same magnitude, so as to ensure the current flowing in the N-type and the P-type thermoelectric material at each of the source terminal and the drain terminal have identical magnitude but opposite directions, and thus the current for a normal operation of the device is not affected. Moreover, since the thermoelectric material has a small resistance while the substrate has a large resistance, the N-type and the P-type material at the same terminal are designed to be spaced apart as far as possible so that a current from the material to the substrate may be neglected. Taking a 0.13 μm standard process as an example, the source/drain terminal of the field effect transistor has a length of 0.4 μm and a width of 0.8 μm. Therefore, a length of the holes may be designed to be less than 0.4 μm, where a minimum size thereof is determined by a photolithography process;

and a width of the holes is less than about 0.25 μm. A distance between two holes at the same terminal is more than about 0.3 μm.

The present invention takes an N-type SOI field effect transistor having schottky junctions as an example, and uses a 0.13 μpm standard process (only exemplary, but not a limitation condition of the present invention).

Settings of voltages mainly include the following two aspects.

(1) When a dissipation of the device is performed: V1=Vs+1.5V, V2=Vs−1.5V, V3=Vd−1.5V, and V4=Vd+1.5V.

(2) When a dissipation of the device is not performed: V1=Vs, V2=Vs, V3=Vd, and V4=Vd.

The settings of bias voltages of the transistor with a dissipation structure provided by the present invention have been described through above embodiments. It will be appreciated by those skilled in the art, a certain change or modification on the structure of the device according to the present invention may be made without departing from the substantial scope of the present invention, and voltages for testing are not limited to the contents disclosed by the embodiments.

What is claimed is:

1. A heat dissipation structure for a SOI field effect transistor having a schottky source/drain, wherein, in a SOI substrate in the vicinity of a drain terminal of the SOI field effect transistor having the schottky source/drain, two holes are formed, in which an N-type material with high thermoelectric coefficient and a P-type material with high thermoelectric coefficient are filled respectively; the N-type material with high thermoelectric coefficient and the P-type material with high thermoelectric coefficient are connected with the drain terminal of the SOI field effect transistor in manner of ohmic contact; a first metal wire for the N-type material with high thermoelectric coefficient is applied a high potential with respect to the drain terminal, and a second metal wire for the P-type material with high thermoelectric coefficient is applied a low potential with respect to the drain terminal; and when the device does not operate or does not need heat dissipation, potentials of the first and second metal wires connected to the P-type and N-type material with high thermoelectric coefficient are both equal to a drain voltage.

2. The heat dissipation structure according to claim 1, wherein the materials with high thermoelectric coefficient are common compound semiconductor from V-VI group such as $Bi_2Te_3$ and $Bi_2Sb$, a nano material with high thermoelectric coefficient or other material with high thermoelectric coefficient.

3. The heat dissipation structure according to claim 1, wherein the N-type material with high thermoelectric coefficient and the P-type material with high thermoelectric coefficient are both heavily doped and have identical resistance value.

4. The heat dissipation structure according to claim 1, wherein, with each of the source terminal and the drain terminal of the field effect transistor having a length of 0.4 μm and a width of 0.8 μm, a length of each of the holes are less than 0.4 μm, and a width of each of the holes are less than 0.25 μm, where a size of each of the holes has a minimum size determined by a photolithography process.

5. A heat dissipation structure for a SOI field effect transistor having a schottky source/drain, wherein in a first SOI substrate in the vicinity of a drain terminal of the SOI field effect transistor having the schottky source/drain, two holes are formed, in which an N-type material with high thermoelectric coefficient and a P-type material with high thermoelectric coefficient are filled, respectively; the N-type material with high thermoelectric coefficient and the P-type material with high thermoelectric coefficient are connected with the drain terminal of the SOI field effect transistor in manner of ohmic contact; in a second SOI substrate in the vicinity of a source terminal of the SOI field effect transistor having the schottky source/drain, two holes are formed, in which an N-type material with high thermoelectric coefficient and a P-type material with high thermoelectric coefficient are filled, respectively; the N-type material with high thermoelectric coefficient and the P-type material with high thermoelectric coefficient are connected with the source terminal of the SOI field effect transistor in manner of ohmic contact; a first metal wire for the N-type material with high thermoelectric coefficient in the vicinity of the drain terminal is applied a high potential with respect to the drain terminal, and a second metal wire for the P-type material with high thermoelectric coefficient in the vicinity of the drain terminal is applied a low potential with respect to the drain terminal; a third metal wire for the N-type material with high thermoelectric coefficient in the vicinity of the source terminal is applied a high potential with respect to the source terminal, and a fourth metal wire for the P-type material with high thermoelectric coefficient in the vicinity of the source terminal is applied a low potential with respect to the source terminal; when the device does not operate or does not need heat dissipation, potentials of third and fourth metal wires connected to the N-type and P-type materials with high thermoelectric coefficient in the vicinity of the source terminal are both equal to a source voltage; and potentials of first and second metal wires connected to the N-type and P-type materials with high thermoelectric coefficient in the vicinity of the drain terminal are both equal to a drain voltage.

6. The heat dissipation structure according to claim 5, wherein the materials with high thermoelectric coefficient are common compound semiconductor from V-VI group such as $Bi_2Te_3$ and $Bi_2Sb$, a nano material with high thermoelectric coefficient or other material with high thermoelectric coefficient.

7. The heat dissipation structure according to claim 5, wherein the N-type material with high thermoelectric coefficient and the P-type material with high thermoelectric coefficient are both heavily doped and have identical resistance value.

8. The heat dissipation structure according to claim 5, wherein, with each of the source terminal and the drain terminal of the field effect transistor having a length of 0.4 μm and a width of 0.8 μm, a length of each of the holes are less than 0.4 μm, and a width of each of the holes are less than 0.25 μm, where a size of each of the holes has a minimum size determined by a photolithography process.

9. The heat dissipation structure according to claim 8, wherein, a distance between the two holes at the drain terminal or the source terminal is more than 0.3 μm.

10. The heat dissipation structure according to claim 8, wherein, a distance between the two holes at the drain terminal or the source terminal is more than 0.3 μm.

* * * * *